United States Patent
Huh et al.

(10) Patent No.: US 7,704,816 B2
(45) Date of Patent: Apr. 27, 2010

(54) BORON DERIVED MATERIALS DEPOSITION METHOD

(75) Inventors: Jeong-Uk Huh, Santa Clara, CA (US); Mihaela Balseanu, Sunnyvale, CA (US); Li-Qun Xia, Santa Clara, CA (US); Derek R. Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/171,783

(22) Filed: Jul. 11, 2008

(65) Prior Publication Data
US 2009/0017640 A1 Jan. 15, 2009

Related U.S. Application Data

(60) Provisional application No. 60/949,796, filed on Jul. 13, 2007.

(51) Int. Cl.
*H01L 21/336* (2006.01)
(52) U.S. Cl. ............... 438/197; 438/303; 438/299; 438/301; 438/304; 438/305; 257/59; 257/72; 257/66
(58) Field of Classification Search ............... 427/228; 438/197, 299, 301, 303, 304, 305; 257/59, 257/66, 72
See application file for complete search history.

(56) References Cited

U.S. PATENT DOCUMENTS

| 5,558,908 | A |   | 9/1996  | Lukacs, III et al. |
|-----------|---|---|---------|--------------------|
| 5,837,607 | A |   | 11/1998 | Quick              |
| 5,952,677 | A | * | 9/1999  | Park ............ 257/66 |
| 5,994,762 | A |   | 11/1999 | Suwanai et al.     |
| 6,165,551 | A | * | 12/2000 | Lukacs et al. ...... 427/228 |
| 6,228,731 | B1 | * | 5/2001 | Liaw et al. ......... 438/303 |
| 2006/0289951 | A1 |   | 12/2006 | Weimer         |

OTHER PUBLICATIONS

PCT International Search Report and Written Opinion dated Oct. 1, 2008 for International Application No. PCT/US2008/69218.

* cited by examiner

*Primary Examiner*—Matthew Smith
*Assistant Examiner*—Wilner Jean Baptiste
(74) *Attorney, Agent, or Firm*—Patterson & Sheridan

(57) ABSTRACT

Methods of forming boron-containing films are provided. The methods include introducing a boron-containing precursor into a chamber and depositing a network comprising boron-boron bonds on a substrate by thermal decomposition or a plasma process. The network may be post-treated to remove hydrogen from the network and increase the stress of the resulting boron-containing film. The boron-containing films have a stress between about −10 GPa and 10 GPa and may be used as boron source layers or as strain-inducing layers.

12 Claims, 8 Drawing Sheets

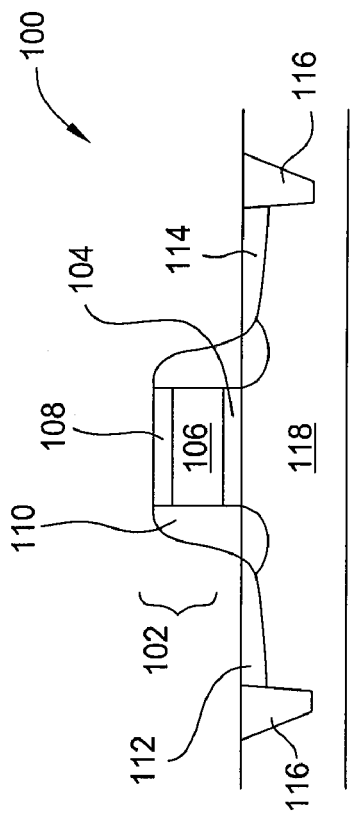
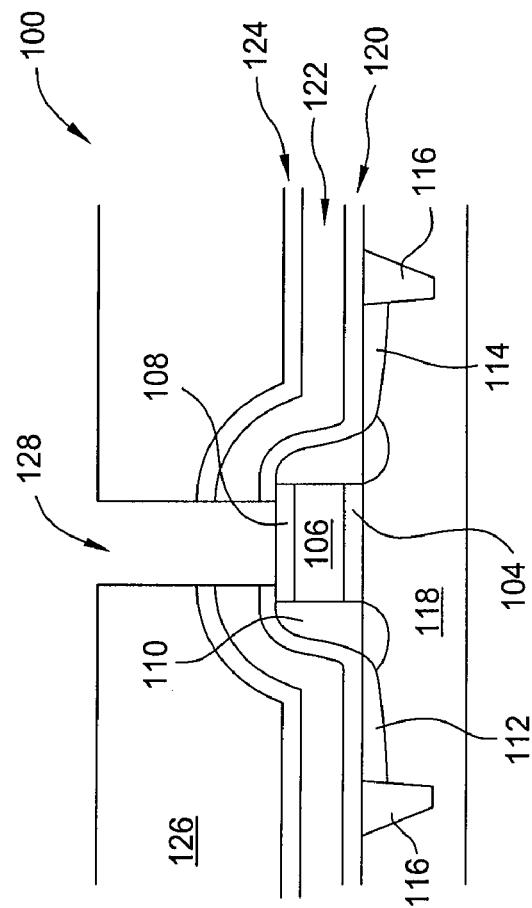

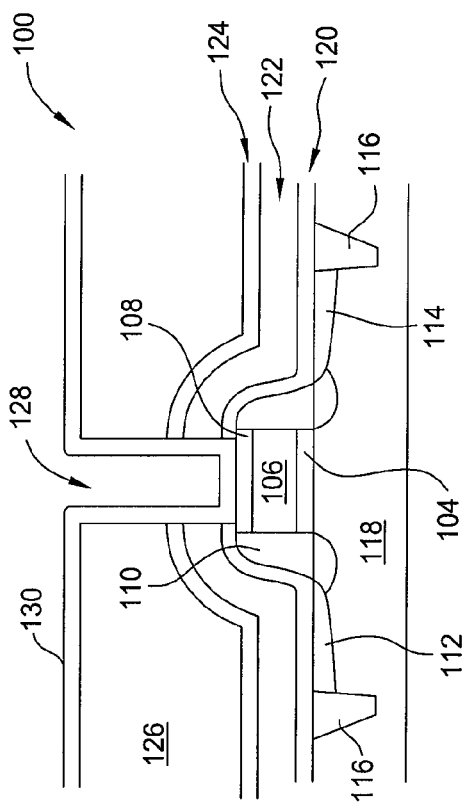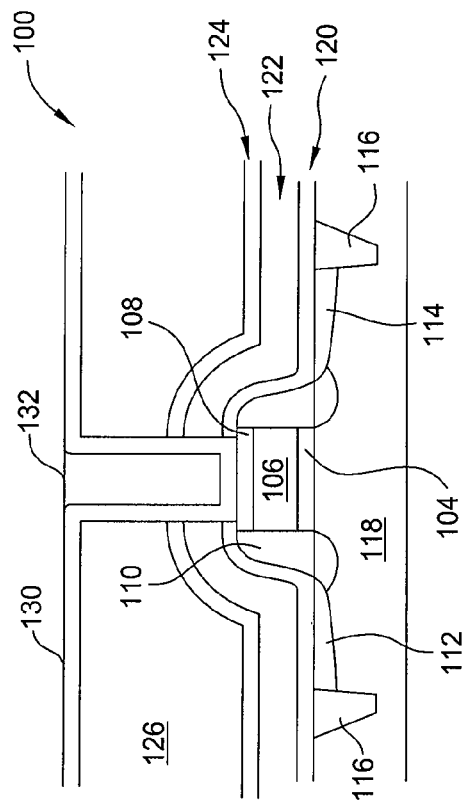
FIG. 6C
FIG. 6D

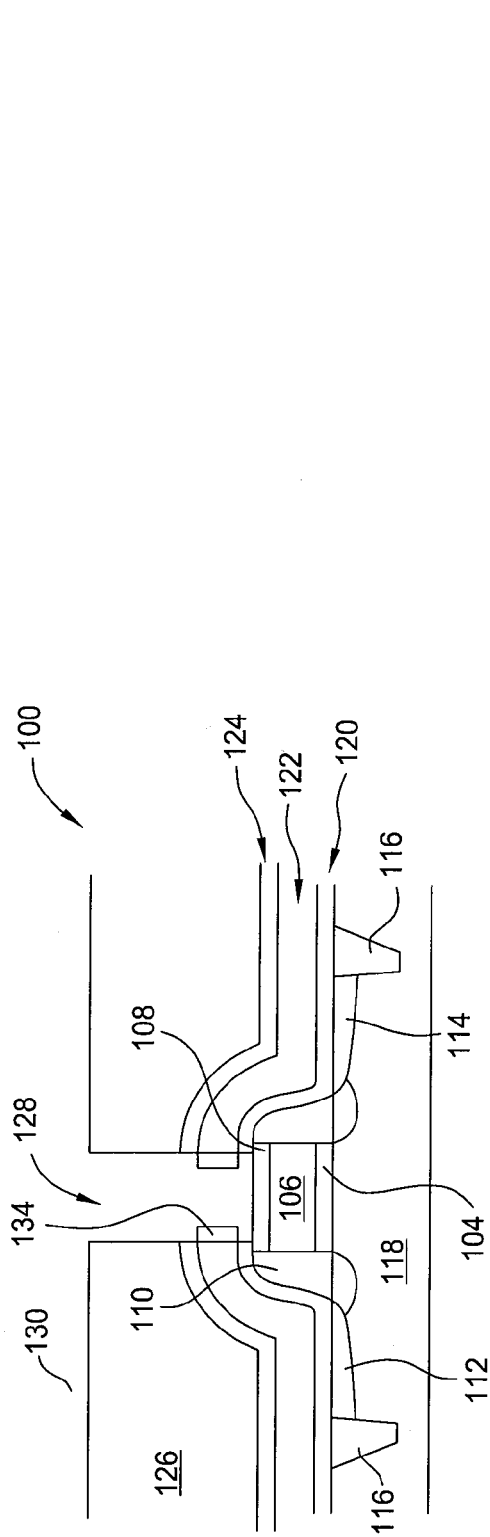
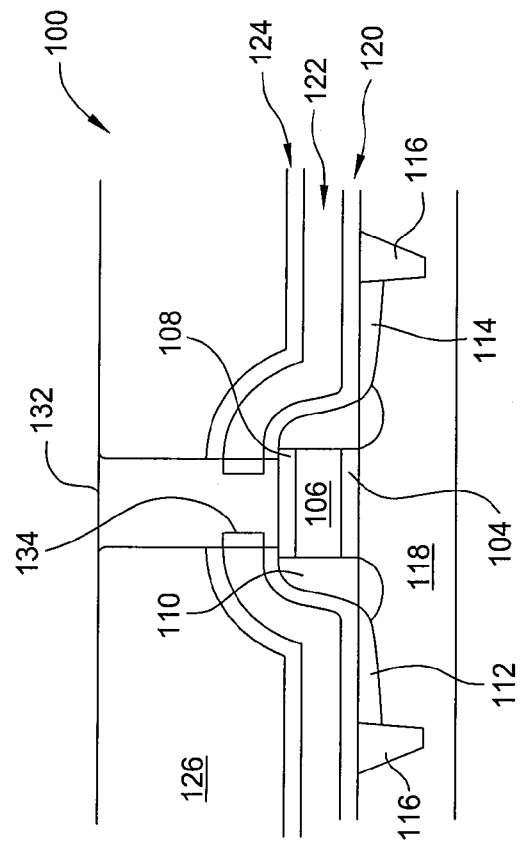
FIG. 6E
FIG. 6F

BORON DERIVED MATERIALS DEPOSITION METHOD

CROSS-REFERENCE TO RELATED APPLICATIONS

This application claims benefit of U.S. Provisional Patent Application Ser. No. 60/949,796, filed Jul. 13, 2007, which is herein incorporated by reference.

BACKGROUND OF THE INVENTION

1. Field of the Invention

Embodiments of the present invention generally relate to methods of forming films on substrates, such as semiconductor substrates. More particularly, embodiments of the present invention relate to methods for forming boron-containing films on substrates.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 90 nm feature sizes, and tomorrow's facilities soon will be producing devices having even smaller feature sizes.

The continued reduction in device geometries and the increasingly dense spacing of devices on semiconductor substrates have presented challenges in the area of improving device performance. For example, while the performance of a metal-oxide-semiconductor field effect transistor (MOSFET) device can be improved by several methods, such as reducing the gate dielectric thickness of the device, the very thin dielectric layers required by small devices may allow dopants from the gate electrode to penetrate through the gate dielectric into the underlying silicon substrate. A very thin gate dielectric may also increase gate leakage that increases the amount of power consumed by the gate and eventually damages the transistor.

Straining the atomic lattice of materials in devices is a recently developed, alternative method of improving device performance. Straining the atomic lattice improves device performance by increasing carrier mobility in a semiconductor material. The atomic lattice of one layer of a device can be strained by depositing a stressed film over the layer. For example, stressed silicon nitride (SiN) layers used as etch stop layers over a gate electrode can be deposited to induce strain in the channel region of the transistor. The stressed, strain-inducing silicon nitride layers can have compressive stress or tensile stress.

While plasma-enhanced chemical vapor deposited (PECVD) silicon nitride layers having relatively high stress levels have been developed, there remains a need for a method for forming films that have higher tensile stress levels than silicon nitride, which typically has a tensile stress of no more than 1.7 GPa.

SUMMARY OF THE INVENTION

Embodiments of the present invention generally provide methods of forming boron-containing films. In one embodiment, a method of forming a boron-containing film comprises introducing a boron-containing precursor into a chamber and depositing a network comprising boron-boron bonds on a substrate in the chamber from the boron-containing precursor by a thermal decomposition process in the absence of a plasma. The network is post-treated to remove hydrogen from the network. The post-treated network forms a boron-containing film that comprises B12 icosahedrons and/or fused B12 icosahedrons and has a stress between about 10 GPa and about 10 GPa.

In another embodiment, a method of forming a boron-containing film comprises introducing a boron-containing precursor into a chamber and depositing a network comprising boron-boron bonds on a substrate in the chamber from the boron-containing precursor in the presence of a plasma. The network forms a boron-containing film that comprises B12 icosahedrons and/or fused B12 icosahedrons and has a stress between about −10 GPa and about 10 GPa.

In further embodiments, methods of using boron-containing films are provided. In one embodiment, the boron-containing films are used to dope an underlying layer with boron. In another embodiment, a method of processing a substrate comprises depositing a liner over a transistor structure on a substrate, forming a boron-containing film on the liner, and depositing a cap on the boron-containing film. A premetal dielectric layer is deposited on the cap. The premetal dielectric layer, the cap, the boron-containing film, and the liner are then etched to form a contact via to a gate stack of the transistor structure. Regions of the boron-containing film that are exposed by the etching are then sealed. Sealing the exposed regions may comprise depositing a dielectric liner over the transistor structure, including the exposed regions of the boron-containing film, or treating the exposed regions with a nitridation or oxidation process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6A-6F illustrate integration schemes according to embodiments of the invention.

DETAILED DESCRIPTION

Embodiments of the present invention provide methods of depositing boron-containing films, such as boron nitride and boron carbide films, for example. The boron-containing films may be undoped boron nitride (BN), undoped boron carbide (BC) films, or doped boron nitride or boron carbide films, such as boron silicon nitride (BSiN), boron carbon nitride (BCN), silicon boron nitride (SiBN) and boron carbon silicon nitride (BCSiN) films. The boron-containing films have a high intrinsic stress, i.e., between about −10 GPa and about 10 GPa, such as a tensile stress that is greater than about 2.0 GPa. It is believed that the high stress of the films is provided at least in part by the presence of B12 icosahedrons within the films. The boron content of the boron-containing films having a high tensile stress, i.e., a stress greater than about 2.0 GPa, may be between about 5 atomic % and about 100 atomic %. The tensile stress typically increases with the boron content.

Boron-containing Film Deposition and Properties

In one embodiment, a boron-containing film is deposited by a thermal decomposition process, i.e., a non-plasma process, followed by a post-treatment. For the thermal decomposition process, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. A boron-containing precursor is introduced into the chamber, such as at a flow rate between about 5 sccm and about 50 slm, such as between 10 sccm and about 1 slm, and pyrolyzed. Examples of chambers that may be used for the deposition are the PRODUCER® SE and PRODUCER® GT PECVD chambers, both of which are available from Applied Materials, Inc. of Santa Clara, Calif. The processing conditions provided herein are provided for a 300 mm PRODUCER® SE chamber with two isolated processing regions, with one substrate per processing region. Thus, the flow rates experienced per each substrate processing region and substrate are half of the flow rates into the chamber.

A network comprising boron-boron bonds is formed on a substrate on the substrate support during the pyrolysis of the boron-containing precursor. The substrate may be a silicon, silicon-containing, or glass substrate. The substrate may be a bare substrate or have one or more layers of material deposited thereon and/or features formed therein. The network comprising boron-boron bonds may have a tensile stress greater than about 10 MPa and comprise between about 3 and about 50 atomic percent hydrogen. The network comprising boron-boron bonds may be amorphous or have a low degree of crystallinity and comprises boron rings randomly linked by boron-boron bonds. In one aspect, an amorphous boron:hydrogen network is formed on a substrate by $B_2H_6$ polymerization.

Figure 1:
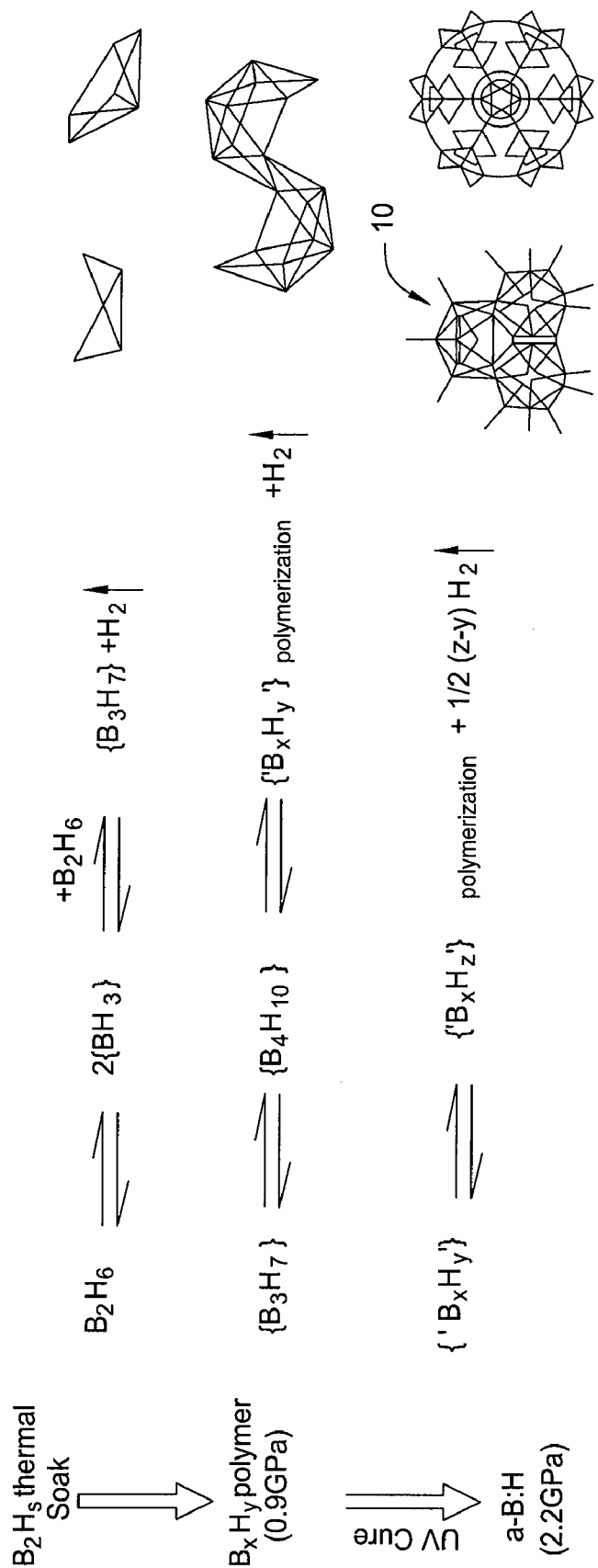
FIG. 1 is a chart summarizing the polymerization reactions of a boron-containing precursor and the resulting structures.

After the network comprising boron-boron bonds is formed, the network is post-treated to remove hydrogen from the network. Hydrogen removal from the network increases the tensile stress of the network. The post-treatment is selected from the group consisting of a plasma process, an ultraviolet (UV) cure process, a thermal anneal process, and combinations thereof, in any order. For example, the network comprising boron-boron bonds may be treated with a UV cure process and then a plasma process. FIG. 1 illustrates reactions which may take place during polymerization of the boron-containing precursor to form the network and the structures comprising B12 icosahedrons 10 in the boron-containing film after post-treatment.

For a plasma process post-treatment, the plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

The plasma process may be performed in an ambient comprising a nitrogen-containing precursor and one or more dilution gases. Nitrogen-containing precursors that may be used include $N_2$, $NH_3$, and $N_2H_4$, and dilution gases that may be used include Ar, He, $H_2$, and Xe. The nitrogen-containing precursor may be introduced into the chamber at a flow rate of between about 5 sccm and about 50 slm, such as between about 100 sccm and about 500 sccm, during the plasma treatment. The nitrogen-containing precursor may be flowed into the chamber for a period of time, such as between about 1 second and about 2 hours, such as between about 1 second and about 60 seconds. The chamber pressure may be between about 10 mTorr and about 760 Torr, and the temperature of a substrate support in the chamber may be between about 20° C. and about 1000° C. during the treatment. Examples of chambers that may be used for the plasma process are the PRODUCER® SE and PRODUCER® GT PECVD chambers.

For a thermal anneal process post-treatment, the network comprising boron-boron bonds is annealed at a temperature that is above the deposition temperature. For example, the network may be annealed at a temperature greater than about 200° C. During the thermal anneal process, a nitrogen-containing precursor may be introduced into the chamber at a flow rate of between about 5 sccm and about 50 slm, such as between about 10 sccm and about 1 slm. The nitrogen-containing precursor may be flowed into the chamber for a period of time such as between about 1 second and about 10 hours, such as between 10 seconds and about 20 minutes. The chamber pressure may be between about 10 mTorr and about 760 Torr, and the temperature of a substrate support in the chamber may be between about 20° C. and about 1000° C. during the treatment. Examples of chambers that may be used for the thermal anneal process are the PRODUCER® SE and PRODUCER® GT PECVD chambers.

For a UV cure process post-treatment, exemplary UV cure process conditions that may be used include a chamber pressure of between about 10 mTorr and about 760 Torr and a substrate support temperature of between about 20° C. and about 1000° C. The substrate support temperature for the UV cure process may be greater than, less than, or equal to the substrate support temperature during the formation of the network comprising boron-boron bonds. The UV radiation may be provided by any UV source, such as mercury microwave arc lamps, pulsed xenon flash lamps, or high-efficiency UV light emitting diode arrays. The UV radiation may have a wavelength of between about 170 nm and about 400 nm, for example. The UV radiation may have a single wavelength, such as 175 nm. Alternatively, the UV radiation may be provided by a broad band UV source that provides wavelengths greater than about 200 nm. The treatment may comprise exposing the network comprising boron-boron bonds to between about 1 Watt/cm$^2$ and about 1000 Watts/cm$^2$ of ultraviolet radiation, and the ultraviolet radiation may provide a photon energy (electronVolts) between about 0.5 eV and about 10 eV, such as between about 1 eV and about 6 eV. The UV cure process typically densities the network comprising boron-boron bonds. An example of a chamber that may be used to perform a UV cure process post-treatment is a NANOCURE™ chamber, available from Applied Materials, Inc. of Santa Clara, Calif.

A nitrogen-containing precursor may be introduced into the chamber at a flow rate of between about 5 sccm and about 50 sccm during the UV cure process post-treatment. The nitrogen-containing precursor may be flowed into the chamber for a period of time such as between about 1 second and about 2 hours, such as between about 1 second and about 10 minutes.

Figure 2:
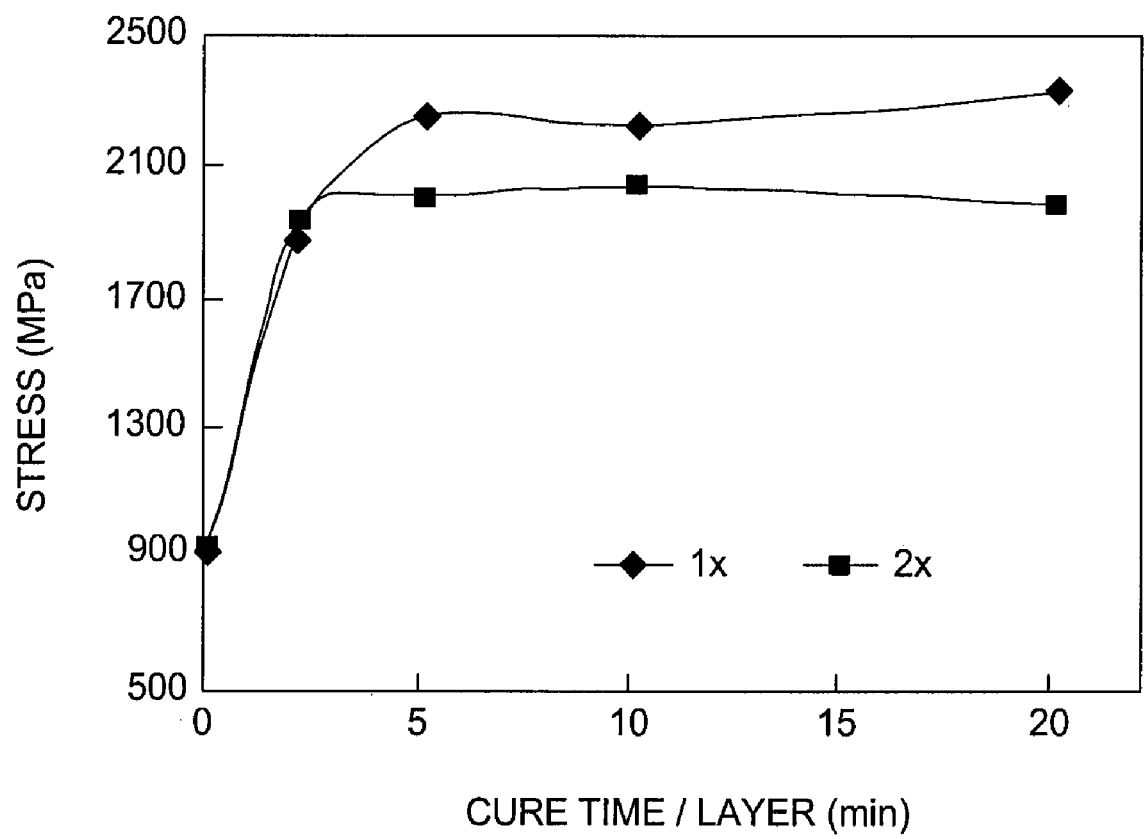
FIG. 2 is a graph showing the effect of a UV cure process on the stress of boron-containing films deposited according to embodiments of the invention.
Figure 3:
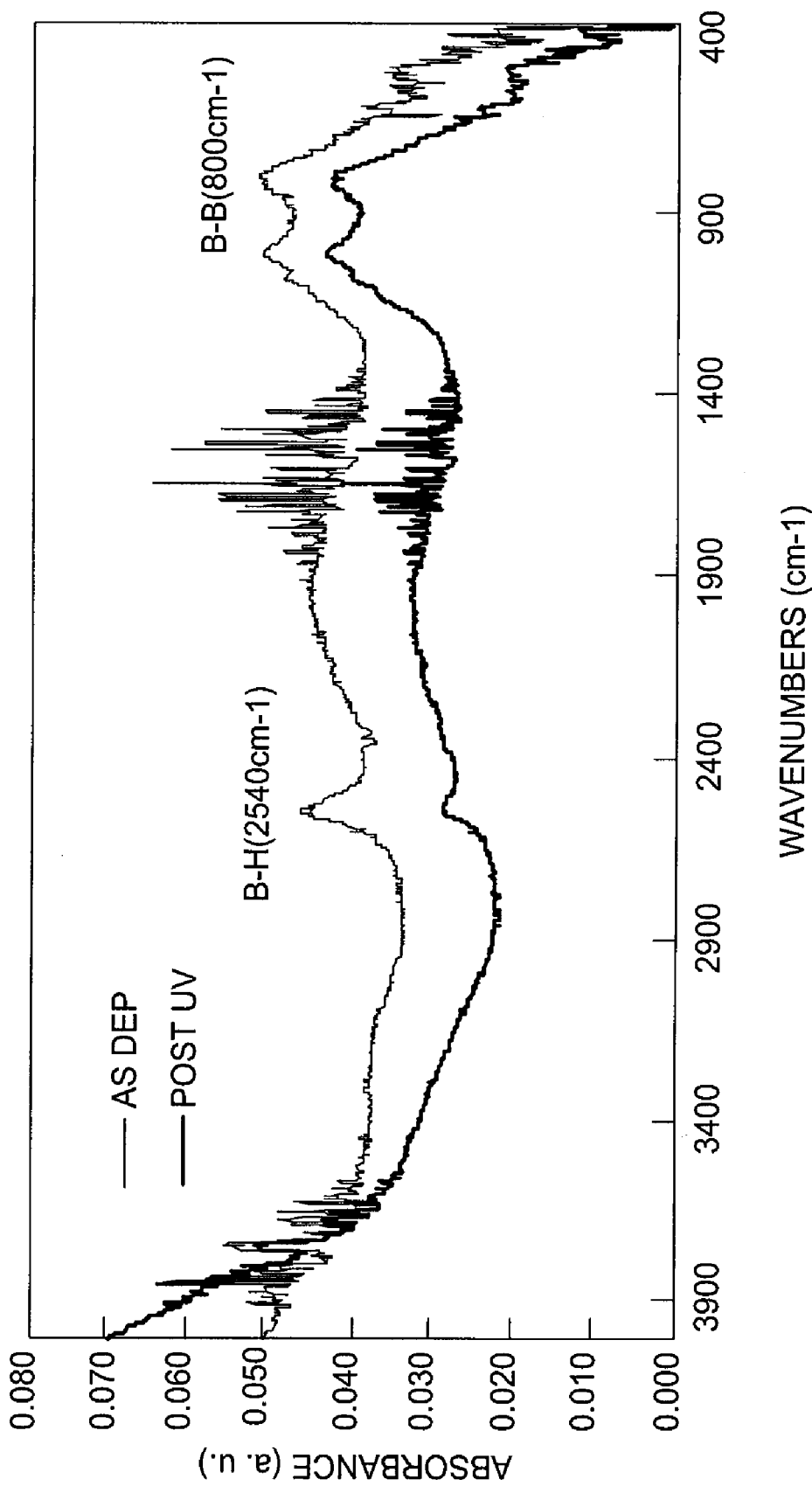
FIG. 3 is a FTIR analysis of a boron-containing film before (as deposited) and after a UV cure process (post UV).

FIG. 2 is a graph showing the effect of the UV cure process on the stress of boron-containing films deposited according to embodiments of the invention. FIG. 3 is a FTIR analysis of a boron-containing film before (as deposited) and after (post UV) a UV cure process. Table I shows a comparison of the properties of high tensile stress boron-containing films before and after a UV cure process.

TABLE I

| Film Properties | as deposited | post UV cure |
|---|---|---|
| Deposition Rate (Å/min) | 100 | — |
| Uniformity (%) | <5 | <5 |
| Refractive Index @ 1000A | 2.7 | 3.0 |
| Stress (MPa) | 900 | 2100 |
| Shrinkage (%) | — | <5 |
| Density (g/cm$^3$) | 1.9 | 2.0 |
| Step Coverage, Pattern Loading Effect (PLE) | >90%, <5% | >90%, <5% |
| Wet Etch Rate Ratio (100:1 HF) | | |
| to thermal oxide | | 0.03 |
| to thermal nitride | | 0.003 |
| Moisture absorption resistance (85/85) | | <20 MPa |

All of the post-treatments described above remove hydrogen from the network comprising boron-boron bonds, which in turn increases the tensile stress of the network and transforms the network into a high stress boron-containing film. All of the post-treatments described above also result in the rearrangement of the network, which leads to the formation of B12 icosahedron clusters and then the fusion of the B12 icosahedron clusters, which results in the formation of a boron-containing film with increased tensile stress.

All of the post-treatments described above can be performed in the same chamber in which the network comprising boron-boron bonds is deposited or a different chamber. If the post-treatment is performed in a different chamber, the post-treatment chamber may be part of an integrated tool that contains the deposition chamber, and the deposition chamber and the post-treatment chamber share a common transfer chamber. For example, a UV cure post-treatment may be performed in a NANOCURE™ chamber that is part of a PRODUCER® platform that includes a deposition chamber in which the network is deposited. Alternatively, the post-treatment may be performed in a different chamber that is completely separated from the chamber in which the network comprising boron-boron bonds is deposited.

Figure 4:
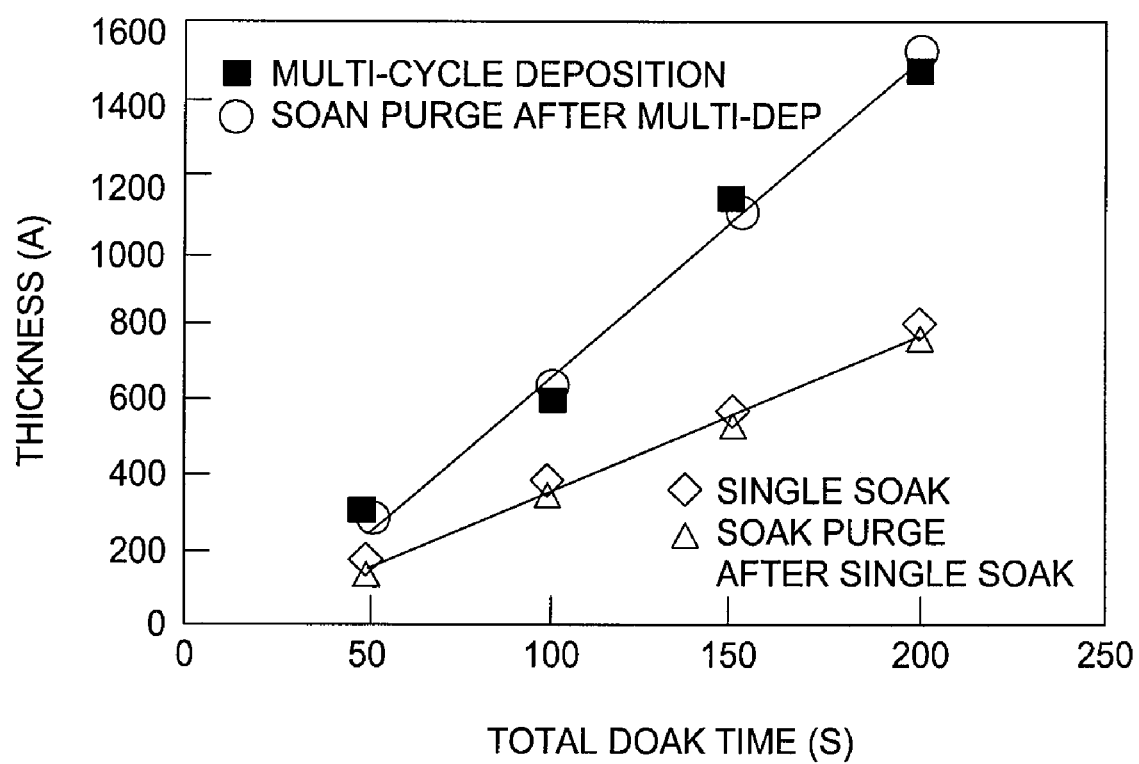
FIG. 4 is a graph that shows a comparison of the thickness of films obtained by either a single deposition and UV post-treatment (i.e., a single soak) or multiple cycles of deposition and UV post-treatment (i.e., soak purge).
Figure 5:
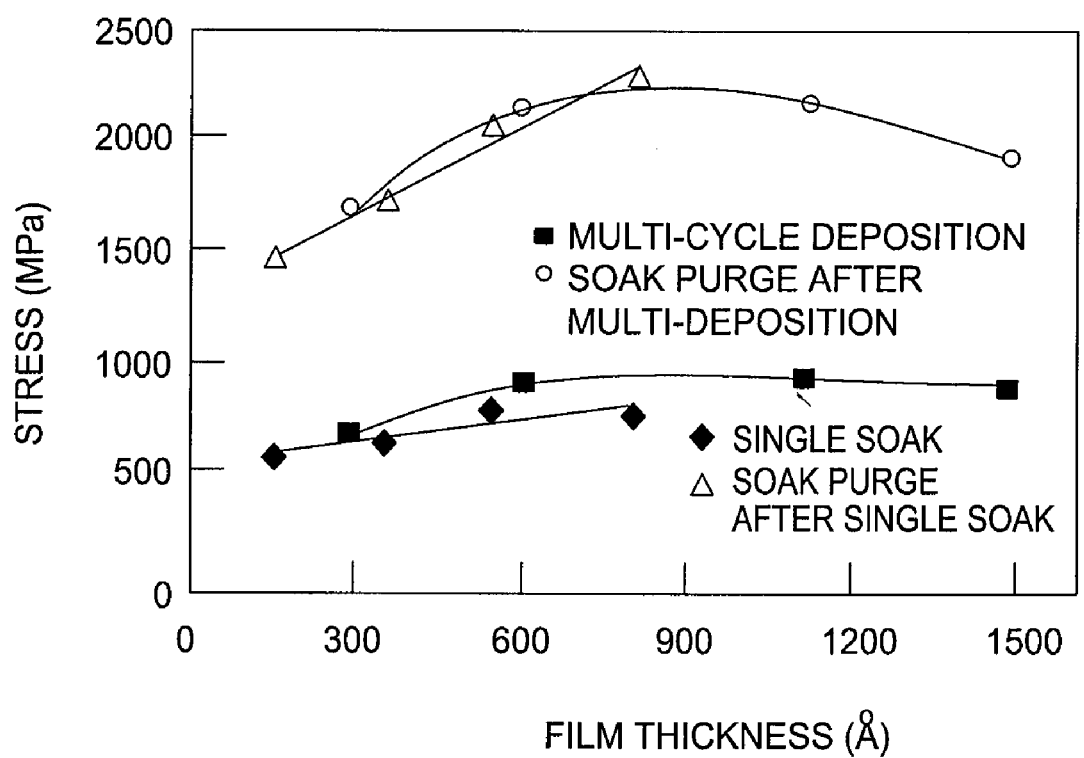
FIG. 5 is a graph that shows a comparison of the film stresses obtained by either a single deposition and UV post-treatment (i.e., a single soak) or multiple cycles of deposition and UV post-treatment (i.e., soak purge).

Although the deposition and post-treatment steps described above are described with respect to a single deposition step followed by a single post-treatment step, boron-containing films provided according to other embodiments of the invention may be formed by multiple cycles of deposition and post-treatment. In such embodiments, a network comprising boron-boron bonds is deposited to a thickness that is only a fraction of the desired final thickness and then post-treated. This deposition and post-treatment sequence may be performed multiple times until a desired thickness is achieved. For example, layers having a thickness of about 2 Å to about 5000 Å, for example, about 2 Å to about 1000 Å, e.g., about 20 Å layers, may be formed in each cycle. The deposition and post-treatment steps in each cycle can be performed in the same chamber, in different chambers that share a common transfer chamber, or in different chambers that do not share a common transfer chamber. FIG. 4 shows a comparison of the thickness of films obtained by either a single deposition and UV post-treatment (i.e., a single soak) or multiple cycles of deposition and UV post-treatment (i.e., soak purge). FIG. 5 shows a comparison of the film stresses obtained by either a single deposition and UV post-treatment (i.e., a single soak) or multiple cycles of deposition and UV post-treatment (i.e., soak purge).

While the network comprising boron-boron bonds in the embodiments described above is deposited by a thermal decomposition process, in other embodiments, a network comprising boron-boron bonds may be deposited in the presence of a plasma, such as in a plasma-enhanced chemical vapor deposition process. For deposition of the network comprising boron-boron bonds in the presence of a plasma in the chamber, a boron-containing precursor is introduced into the chamber. A dilution gas, such as He, $H_2$, $N_2$, Ar, or Xe, may also be introduced into the chamber. The temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

The network comprising boron-boron bonds may provide a desired boron-containing film without further treatment of the network. Alternatively, the network comprising boron-boron bonds may be post-treated to modify its composition and form the desired boron-containing film. The desired boron-containing film has a stress between about −10 GPa compressive and about 10 GPa tensile.

The post-treatment is selected from the group consisting of a plasma process, an ultraviolet (UV) cure process, a thermal anneal process, and combinations thereof, in any order. The plasma, UV, and thermal anneal process conditions provided above for post-treatment of films formed by thermal decomposition may also be used for the post-treatment of films formed by plasma processes.

Boron-containing precursors that may be used for the formation of the network comprising boron-boron bonds by either thermal decomposition or a plasma process include diborane ($B_2H_6$), borazine ($B_3N_3H_6$), and alkyl-substituted derivatives of diborane. Optionally, in addition to the boron-containing precursor, an additional precursor, such as a silicon-containing precursor, a carbon-containing precursor, and/or a nitrogen-containing precursor, may be included in the gas mixture used to deposit the network comprising boron-boron bonds.

Examples of nitrogen-containing precursors that may be used include ammonia ($NH_3$), hydrazine ($N_2H_4$). Examples of silicon-containing precursors that may be used include silane, trisilylamine (TSA), trimethylsilane (TMS), and silazanes, such as hexamethylcyclotrisilazane (HMCTZ). Examples of carbon-containing precursors that may be used include hydrocarbon compounds having the general formula $C_xH_y$, such as alkanes, alkenes, and alkynes.

In one aspect, the additional precursor, such as $NH_3$, may react with the boron-containing precursor in the gas mixture. In another aspect, the additional precursor may be trapped in an amorphous network formed by the boron-containing precursor and comprising boron-boron bonds. The trapped additional precursor may react with the network during a post-treatment. For example, a hydrocarbon additional precursor that is trapped in the network may react with the network to form boron-carbon bonds. Alternatively, the trapped additional precursor may act as a porogen and be substantially removed from the network by the post-treatment. Stress is increased by removing the porogen and decreasing the formed porosity during the treatment. In other words, the substantial removal of the porogen results in the formation of voids in the network, and with during further treatment, the network shrinks to eliminate the voids, resulting in a more thermodynamically favorable, reduced surface area film that has increased stress.

The additional precursor can be chosen to modify the chemical composition as well as other properties, such as the dielectric properties, of the resulting boron-containing film. For example, a nitrogen-containing precursor can be used in a mixture to form a boron nitride or doped boron nitride film, a silicon-containing precursor can be used in a mixture to form a boron silicon nitride film, and a carbon-containing precursor can be used in a mixture to form a boron carbide film, a boron carbon nitride film, or a boron carbon silicon nitride film.

Boron-containing films provided herein that are not deposited using an additional precursor are typically wide band-gap semiconductors having an energy band gap (Eg) of greater than about 4.0 eV. It has been observed that adding nitrogen to the network comprising boron-boron bonds improves the network's dielectric properties, such as increasing the dielectric breakdown voltage, and reduces leakage current through the formation of a boron nitride network. Boron-containing films with desirable dielectric properties are further described in U.S. patent application Ser. No. 11/765,257, filed on Jun. 19, 2007, which is herein incorporated by reference. The nitrogen can be introduced into the boron-containing films either during the deposition of the network comprising boron-boron bonds or during a post-treatment, such as a UV cure, plasma treatment, or thermal anneal, that includes the presence of a nitrogen-containing precursor. The nitrogen can be introduced into the boron-containing films by using a nitrogen-containing precursor, such as $N_2$ or $NH_3$, in addition to the boron-containing precursor, or a boron-containing precursor that also includes nitrogen, such as borazine.

The boron-containing films provided herein typically have a step coverage of greater than 80% when they are deposited on patterned substrates. The boron-containing films also have good gap fill properties, e.g., no void or seam formation in the filled gaps.

Boron-containing Film Applications

The boron-containing films provided herein may be used as a boron source layer for doping an underlying layer with boron. The boron source layer may be used instead of an ion implant process to incorporate boron into a layer. For example, a boron-containing film may be deposited on a silicon layer and then annealed in order to introduce boron into the silicon layer to form a shallow boron-doped junction in the silicon layer. The boron-containing film may be removed after a desired amount of boron is introduced into the underlying layer.

The boron-containing films provided herein may also be used as strain-inducing layers. For example, a boron-containing film may be deposited over a gate structure to induce strain in the channel region of a transistor. The strain-inducing boron-containing film may be used with a liner underneath it and/or a cap on top of it. The liner and cap layers have a lower boron content than the strain-inducing boron containing film. The lower boron content of the liner and cap layers extends the use of the strain-inducing boron-containing film by providing better insulating properties, such as reduced leakage current, compared to the higher boron content, strain-inducing boron-containing films.

The liner and cap may be silicon nitride, boron nitride, or boron oxide layers, for example. The liner may have a thickness of between about 2 Å and about 500 Å. The boron nitride and boron oxide layers may be deposited according to any of the methods provided herein for forming the boron-containing films with the exception that the boron nitride and boron oxide layers are deposited under conditions sufficient to provide a lower boron concentration in the boron nitride or oxide layer relative to the boron-containing film.

FIGS. 6A-6F illustrate an integration scheme that includes a high tensile stress, strain-inducing boron-containing film that is between a liner layer and a cap layer. FIG. 6A shows a transistor structure 100 that is on a substrate (not shown). The transistor structure 100 comprises a gate stack 102. The gate stack 102 includes a gate dielectric layer 104 and a gate electrode layer 106. A hard mask layer 108 is formed on the gate electrode layer 106. Spacers 110 contact the sidewalls of the gate dielectric layer and the gate electrode layer. The gate stack 102 is between source region 112 and drain region 114. Field isolation regions 116 formed in the structure isolate a well 118 of one type of conductivity, e.g., an n-type (NMOS), from adjacent wells (not shown) of another type of conductivity, e.g., p-type.

A liner 120 is deposited on the structure 100, and a boron-containing film 122 is deposited on the liner 120. A cap 124 is then deposited on the boron-containing film. The liner 120, boron-containing film 122, and cap 124 may be any of the liners, boron-containing films, and caps, respectively, described herein.

A premetal dielectric layer (PMD) 126 is then deposited on the cap 124 and treated with chemical mechanical polishing (CMP). The premetal dielectric layer 126 is then patterned, and the premetal dielectric layer 126, the cap 124, boron-containing film 122, and liner 120 are etched to form a contact via 128 to the gate stack 102. The resulting structure is shown in FIG. 6B.

After the contact via 128 is formed, the structure may be subjected to one of two different process sequences. One sequence is shown in FIGS. 6C-6D, and another sequence is shown in FIGS. 6E-6F. In the sequence shown in FIGS. 6C-6D, a dielectric liner 130 is deposited on the structure, as shown in FIG. 6C. The dielectric liner 130 may be a silicon nitride layer, a boron nitride layer, or a boron oxide layer, for example. Generally, the dielectric liner 130 may be any other dielectric film that has a breakdown field of greater than about 3 MV/cm. The dielectric liner may have a thickness of between about 10 Å and about 100 Å. The dielectric liner 130 seals the regions of the boron-containing film 122 that are exposed by the contact etch.

The dielectric liner 130 is then etched from the bottom of the contact via, and tungsten is deposited on the structure to fill the contact via 128. The dielectric liner 130 may be etched by a conventional dielectric etch process or other etch processes. The tungsten is then chemically mechanically polished to remove the excess tungsten over the structure and planarize the upper surface of the tungsten plug 132 formed in the contact via. The resulting structure is shown in FIG. 6D.

In the sequence shown in FIGS. 6E-6F, the regions of the boron-containing film 122 that are exposed by the contact etch are treated with a nitridation or oxidation process to create a dielectric surface 134 on the exposed regions that seals the exposed regions, as shown in FIG. 6E. The nitridation or oxidation process may be performed during or after the removal of a photoresist that may be used to pattern the premetal dielectric layer 126 for the formation of the contact via 128. The nitridation and oxidation processes may be plasma processes, UV cure processes, thermal anneal processes, or combinations thereof. The process conditions for the plasma, UV cure, and thermal anneal post-treatments described above may be used for the nitridation and oxidation processes.

The nitridation processes comprise exposing the boron-containing film to a nitrogen-containing precursor to incorporate nitrogen into the film. The nitrogen-containing precursor may be nitrogen gas ($N_2$), ammonia ($NH_3$), or hydrazine ($N_2H_4$), for example. The nitrogen-containing precursor may be diluted with a dilution gas such as argon, helium, hydrogen, or xenon.

The oxidation processes comprise exposing the boron-containing film to an oxygen-containing precursor to incorporate oxygen into the film. The oxygen-containing precursor may be oxygen gas ($O_2$), nitrous oxide ($N_2O$) or carbon dioxide ($CO_2$).

Returning to FIGS. 6E-6F, tungsten is then deposited on the structure to fill the contact via 128. The tungsten is then chemically mechanically polished to remove the excess tungsten over the structure and planarize the upper surface of the tungsten plug 132 formed in the contact via. The resulting structure is shown in FIG. 6F.

While the foregoing is directed to embodiments of the present invention, other and further embodiments of the invention may be devised without departing from the basic scope thereof, and the scope thereof is determined by the claims that follow.

What is claimed is:

1. A method of forming a boron-containing film, comprising:
   introducing a boron-containing precursor into a chamber;
   depositing a network comprising boron-boron bonds on a substrate in the chamber from the boron-containing precursor by a thermal decomposition process in the absence of a plasma;
   post-treating the network comprising boron-boron bonds to remove hydrogen from the network, wherein the post-treated network forms a boron-containing film that has a stress between about −10 GPa and about 10 GPa.

2. The method of claim 1, wherein the post-treating comprises a treatment selected from the group consisting of a plasma process, a UV cure process, a thermal anneal process, and combinations thereof.

3. The method of claim 1, further comprising repeating the introducing, depositing, and post-treating until a desired thickness of the boron-containing film is obtained.

4. The method of claim 1, further comprising using the boron-containing film to dope an underlying layer with boron.

5. The method of claim 1, wherein the network comprising boron-boron bonds comprises between about 3 and about 50 atomic percent hydrogen.

6. The method of claim 1, further comprising introducing an additional precursor into the chamber to modify the composition of the boron-containing film, wherein the additional precursor is selected from the group consisting of a silicon-containing precursor, a carbon-containing precursor, a nitrogen-containing precursor, and combinations thereof.

7. The method of claim 6, wherein the additional precursor acts as a porogen and is substantially removed from the network by the post-treating.

8. The method of claim 7, wherein the porogen removal from the network by the post-treating leads to a tensile stress increase in the boron-containing film.

9. The method of claim 6, wherein the additional precursor is a nitrogen-containing precursor that adds nitrogen to the network.

10. A method of processing a substrate, comprising:
    depositing a boron-containing film on a transistor structure on a substrate;
    depositing a premetal dielectric layer on the boron-containing film;
    etching the premetal dielectric layer and the boron-containing film to form a contact via to a gate stack of the transistor structure; and
    sealing regions of the boron-containing film that are exposed by the etching, wherein the depositing the boron containing film comprises:
    introducing a boron-containing precursor into a chamber; and
    depositing a network comprising boron-boron bonds on the substrate in the chamber from the boron-containing precursor by a thermal decomposition process in the absence or presence of a plasma, wherein depositing the boron-containing film further comprises:
    post-treating the network comprising boron-boron bonds to remove hydrogen from the network, wherein the post-treated network forms a boron-containing film that has a stress between about −10 GPa and about 10 GPa.

11. The method of claim 10, wherein the boron-containing film has high conductivity lower than 100 mOhm*cm.

12. The method of claim 10, wherein the boron-containing film has a conformality over 90% when deposited on patterned structures.

* * * * *

UNITED STATES PATENT AND TRADEMARK OFFICE
CERTIFICATE OF CORRECTION

PATENT NO. : 7,704,816 B2  Page 1 of 1
APPLICATION NO. : 12/171783
DATED : April 27, 2010
INVENTOR(S) : Huh et al.

It is certified that error appears in the above-identified patent and that said Letters Patent is hereby corrected as shown below:

In the Summary of the Invention:

Column 2, Line 5, please delete "10" and insert -- −10-- therefor;

In the Detailed Description:

Column 5, Line 3, please delete "densities" and insert --densifies-- therefor.

Signed and Sealed this

Third Day of August, 2010

David J. Kappos
*Director of the United States Patent and Trademark Office*